United States Patent
Ishigaki

(10) Patent No.: US 8,222,530 B2
(45) Date of Patent: Jul. 17, 2012

(54) WIRED CIRCUIT BOARD ASSEMBLY SHEET

(75) Inventor: Saori Ishigaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 243 days.

(21) Appl. No.: 12/654,101

(22) Filed: Dec. 10, 2009

(65) Prior Publication Data

US 2010/0175913 A1 Jul. 15, 2010

Related U.S. Application Data

(60) Provisional application No. 61/202,038, filed on Jan. 22, 2009.

(30) Foreign Application Priority Data

Jan. 9, 2009 (JP) .................................. 2009-003872

(51) Int. Cl.
H05K 1/00 (2006.01)

(52) U.S. Cl. ........ 174/255; 174/250; 174/256; 174/257; 29/832; 29/833; 29/834

(58) Field of Classification Search .......... 174/250–267; 361/732, 748, 760–769, 790–797; 29/825–852, 29/705–710; 438/15, 125
See application file for complete search history.

(56) References Cited

U.S. PATENT DOCUMENTS

| | | | | |
|---|---|---|---|---|
| 5,714,213 | A * | 2/1998 | Antes et al. ...................... 428/30 |
| 6,415,977 | B1 * | 7/2002 | Rumsey ......................... 235/454 |
| 6,889,902 | B2 * | 5/2005 | Rumsey ......................... 235/454 |
| 6,953,989 | B2 * | 10/2005 | Kiriyama ....................... 257/668 |
| 7,393,754 | B2 * | 7/2008 | Iwane et al. ................... 438/401 |
| 7,402,755 | B2 * | 7/2008 | Chen et al. ..................... 174/250 |
| 7,592,551 | B2 * | 9/2009 | Naito et al. .................... 174/250 |
| 7,649,143 | B2 * | 1/2010 | Ohsawa et al. ................ 174/254 |
| 8,017,871 | B2 * | 9/2011 | Naito et al. .................... 174/250 |
| 2005/0247481 | A1 * | 11/2005 | Chen et al. ..................... 174/261 |
| 2006/0144988 | A1 * | 7/2006 | Mitsui et al. ................ 242/412.1 |
| 2007/0170911 | A1 * | 7/2007 | Ohsawa et al. ............. 324/158.1 |
| 2007/0241764 | A1 * | 10/2007 | Naito et al. .................... 324/754 |
| 2009/0126979 | A1 * | 5/2009 | Chae et al. ..................... 174/257 |

FOREIGN PATENT DOCUMENTS

| | | | |
|---|---|---|---|
| JP | 404179184 A | * | 6/1992 |
| JP | 411191668 A | * | 7/1999 |
| JP | 411307889 A | * | 11/1999 |
| JP | 2000-151044 | | 5/2000 |
| JP | 2000-151070 | | 5/2000 |
| JP | 2001-278228 | | 10/2001 |
| JP | 2007-115828 | | 5/2007 |
| JP | 02007184497 A | * | 7/2007 |
| JP | 2007-201085 | | 8/2007 |

* cited by examiner

*Primary Examiner* — Michail V Datskovskiy

(74) *Attorney, Agent, or Firm* — Jean C. Edwards, Esq.; Edwards Neils PLLC

(57) ABSTRACT

A wired-circuit-board assembly sheet includes a plurality of wired circuit boards and a supporting sheet for supporting the wired circuit boards in an aligned state. Each of the wired circuit boards includes a distinguishing mark forming portion to be formed with a distinguishing mark for distinguishing between defectiveness and non-defectiveness of the wired circuit board. The distinguishing mark forming portion is divided by a weir portion for preventing the distinguishing mark from flowing out from the distinguishing mark forming portion.

2 Claims, 6 Drawing Sheets (a)

(b)

(c)

(d)

(e)

(f)

(g)

WIRED CIRCUIT BOARD ASSEMBLY SHEET

CROSS-REFERENCE TO RELATED APPLICATIONS

This patent application claims the benefit of U.S. Provisional Application No. 61/202,038, filed on Jan. 22, 2009, and claims priority from Japanese Patent Application No. 2009-003872, filed on Jan. 9, 2009, the contents of which are herein incorporated by reference in their entirety.

BACKGROUND OF THE INVENTION

1. Field of the Invention

The present invention relates to a wired-circuit-board assembly sheet.

2. Description of Related Art

A suspension board with circuit mounted on a hard disk drive is produced in the form of a suspension-board-with-circuit assembly sheet having a plurality of suspension boards with circuits formed on a single sheet of metal supporting board.

Specifically, the suspension-board-with-circuit assembly sheet is produced in the following manner. Suspension boards with circuits are formed on a single sheet of metal supporting board in an aligned state, the metal supporting board is then partially cut out so as to correspond to an outline of each suspension board with circuit, to thereby form suspension boards with circuits and a supporting sheet for supporting the suspension boards with circuits. Thus, the suspension boards with circuits are produced in the form of a suspension-board-with-circuit assembly sheet in which a plurality of suspension boards with circuits are provided on a single sheet of metal supporting board in an aligned state.

Each of the suspension boards with circuits is appropriately cut off from the above-mentioned suspension-board-with-circuit assembly sheet for wide use in a variety of electric and electronic equipment.

It is known that, in such suspension-board-with-circuit assembly sheet, a distinguishing mark is provided corresponding to each of the suspension boards with circuits for distinguishing between defectiveness and non-defectiveness.

For example, there has been proposed that, in a suspension-board-with-circuit assembly sheet, each of the suspension boards with circuits is inspected in a state of being supported on a supporting sheet, a distinguishing mark (ink) is applied (marked) to some suspension boards with circuits judged as defective as a result of the inspection, using a felt pen, to thereby distinguish the marked suspension boards with circuits as defective (cf. Japanese Unexamined Patent Publication No. 2000-151070).

SUMMARY OF THE INVENTION

In the suspension-board-with-circuit assembly sheet proposed in Japanese Unexamined Patent Publication No. 2000-151070, the distinguishing mark (ink) is applied to a predetermined portion on the suspension board with circuit. However, during the marking, the distinguishing mark (ink) flows out from the predetermined portion, which may result in contamination of the suspension-board-with-circuit assembly sheet and the periphery thereof.

It is an object of the present invention to provide a wired-circuit-board assembly sheet capable of preventing the contamination of the wired-circuit-board assembly sheet and the periphery thereof.

The wired-circuit-board assembly sheet of the present invention includes a plurality of wired circuit boards and a supporting sheet for supporting the wired circuit boards in an aligned state, in which each of the wired circuit boards includes a distinguishing mark forming portion to be formed with a distinguishing mark for distinguishing between defectiveness and non-defectiveness of the wired circuit board, the distinguishing mark forming portion being divided by a weir portion for preventing the distinguishing mark from flowing out from the distinguishing mark forming portion.

According to the wired-circuit-board assembly sheet of the present invention, when the distinguishing mark is formed in the distinguishing mark forming portion of the wired circuit board to show whether the wired circuit board is defective or non-defective, the weir portion can effectively prevent the distinguishing mark from flowing out from the distinguishing mark forming portion.

Therefore, it is possible to prevent contamination of the wired-circuit-board assembly sheet and the periphery thereof by the distinguishing mark.

In the wired-circuit-board assembly sheet of the present invention, it is preferable that the wired circuit board includes a metal supporting layer, an insulating base layer formed on the metal supporting layer, a conductive pattern formed on the insulating base layer, and an insulating cover layer formed on the insulating base layer so as to cover the conductive pattern, the supporting sheet is made of the metal supporting layer, and the weir portion is made of at least one layer selected from the group consisting of the insulating base layer, the conductive pattern, and the insulating cover layer.

In the wired-circuit-board assembly sheet of the present invention, the wired circuit board and the supporting sheet can both be formed from the same metal supporting layer. Further, the wired circuit board and the weir portion can both be formed from at least one layer selected from the group consisting of the same insulating base layer and the same conductive pattern, and the same insulating cover layer.

As a result, the production steps can be simplified, whereby the wired-circuit-board assembly sheet can be produced with high production efficiency.

DETAILED DESCRIPTION OF PREFERRED EMBODIMENTS

Figure 1:
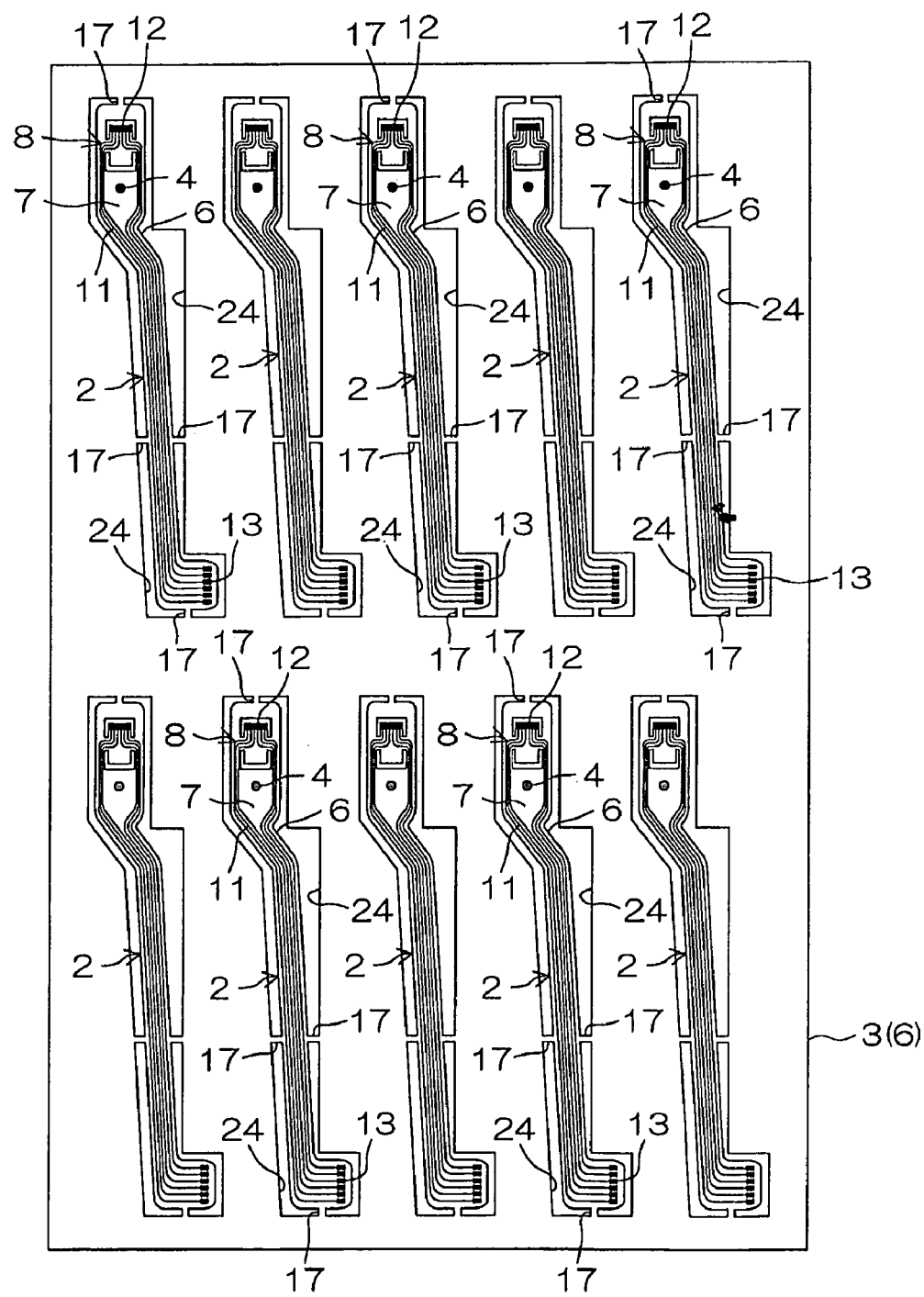
FIG. 1 is a plan view illustrating a suspension-board-with-circuit assembly sheet as an embodiment of a wired-circuit-board assembly sheet according to the present invention.
Figure 2:
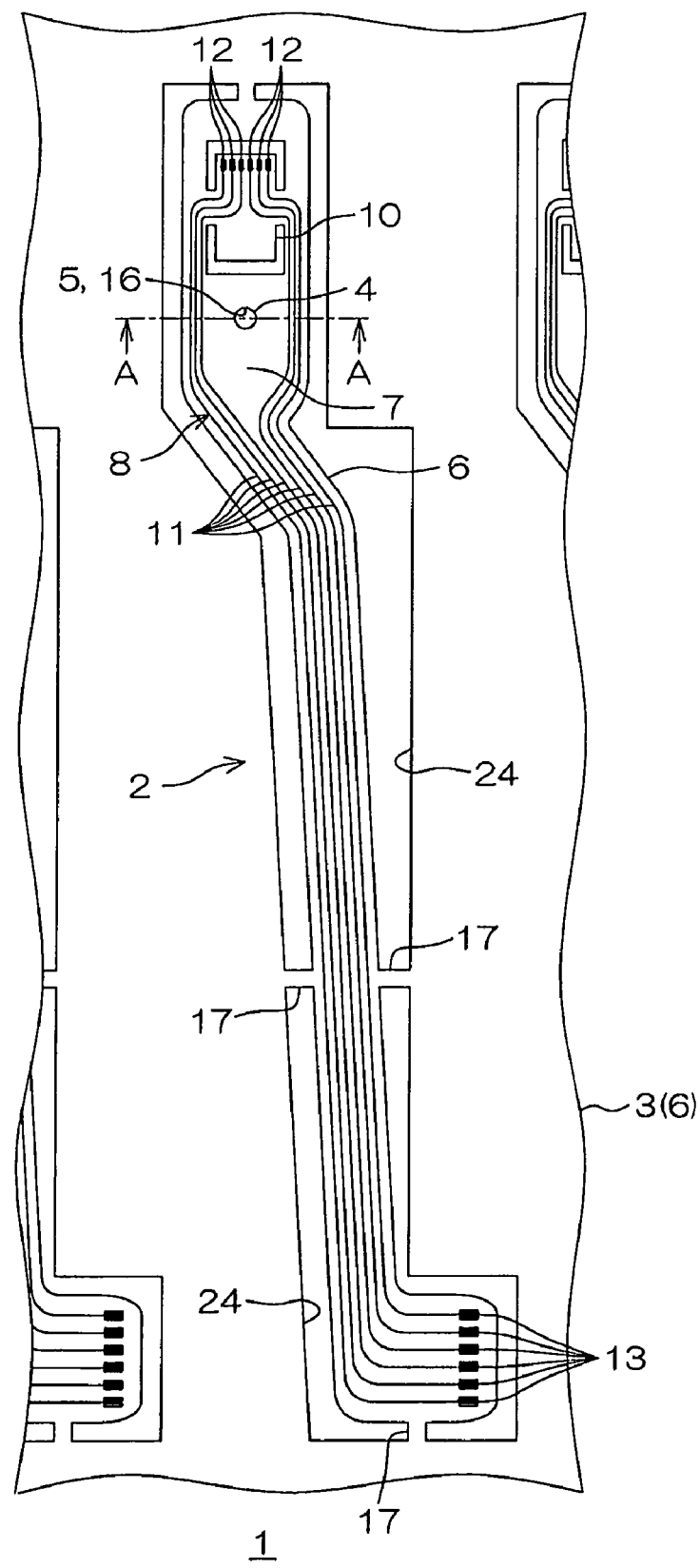
FIG. 2 is an enlarged plan view of a suspension board with circuit in the suspension-board-with-circuit assembly sheet shown in FIG. 1.
Figure 3:
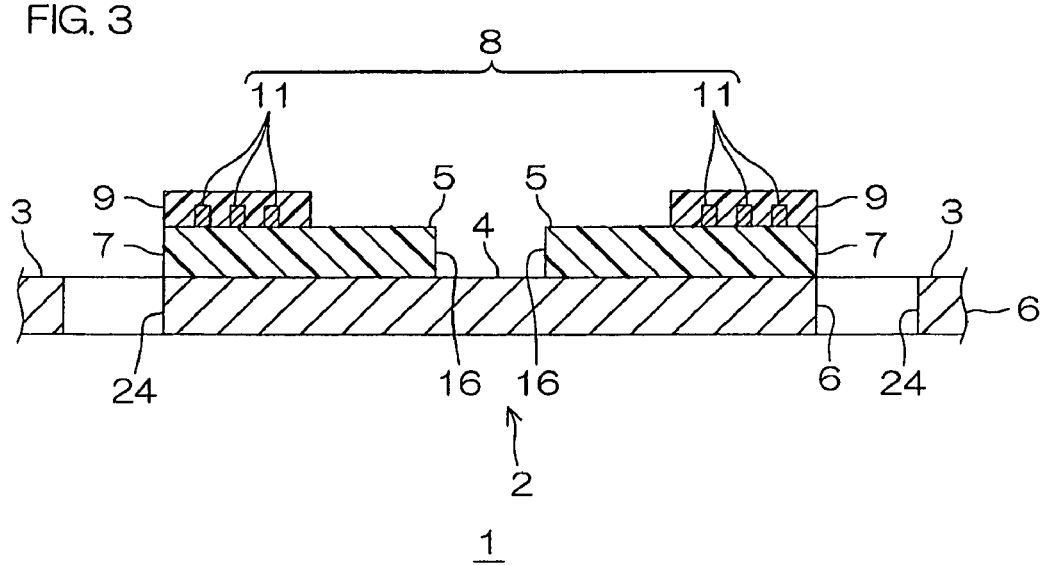
FIG. 3 is a sectional view of the suspension board with circuit taken along the line A-A shown in FIG. 2.
Figure 4:
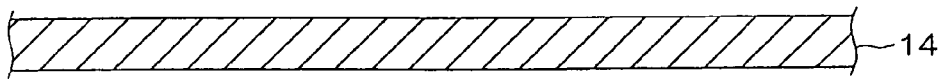
FIG. 4 is a process diagram illustrating the steps of producing a suspension-board-with-circuit assembly sheet, (a) showing the step of preparing a metal supporting board, (b) showing the step of forming an insulating base layer on the metal supporting board in a pattern in which a weir portion is formed, (c) showing the step of forming a conductive pattern on the insulating base layer, (d) showing the step of forming an insulating cover layer on the insulating base layer, (e) showing the step of cutting out the metal supporting board, (f) showing the step of forming a distinguishing mark on a distinguishing mark forming portion of a defective suspension board with circuit, and (g) showing the step of removing the defective suspension board with circuit from a supporting sheet.
Figure 4:
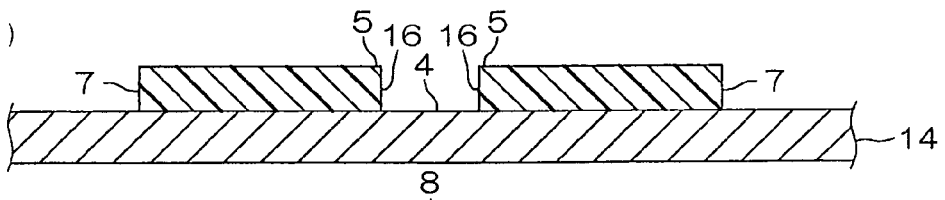
Figure 4:
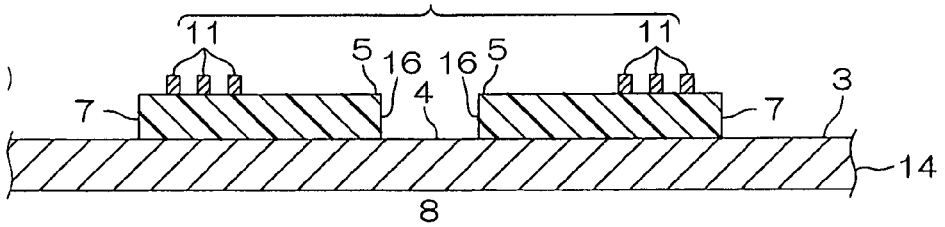
Figure 4:
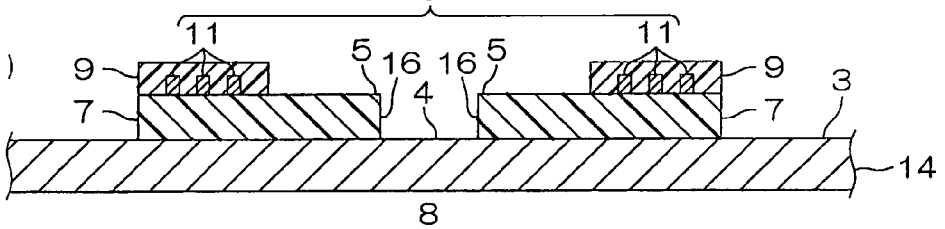
Figure 4:
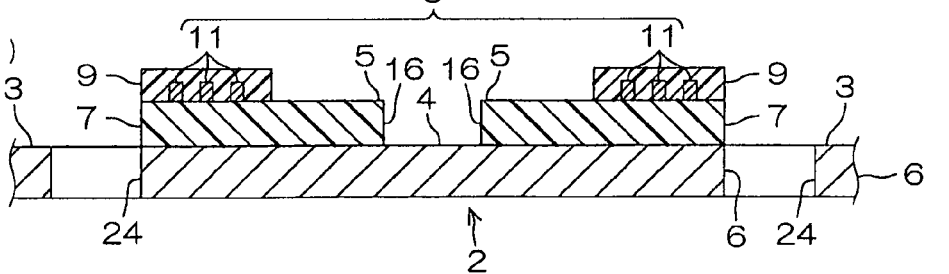
Figure 4:
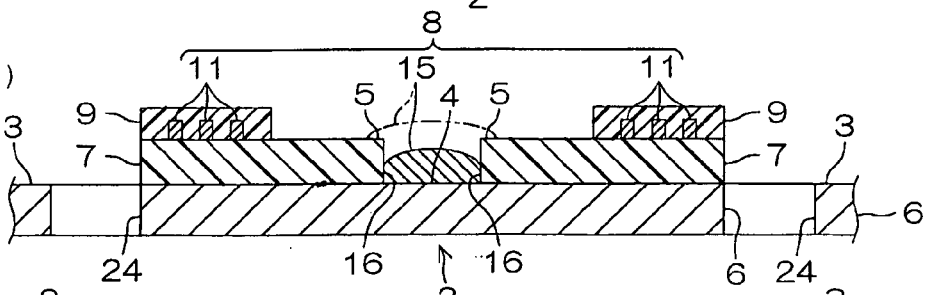
Figure 4:
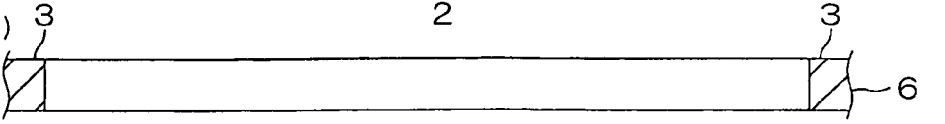

FIG. 1 is a plan view illustrating a suspension-board-with-circuit assembly sheet as an embodiment of a wired-circuit-board assembly sheet according to the present invention, FIG. 2 is an enlarged plan view of a suspension board with circuit in the suspension-board-with-circuit assembly sheet shown in FIG. 1, FIG. 3 is a sectional view of the suspension board with circuit taken along the line A-A shown in FIG. 2, and FIG. 4 is a process diagram illustrating the steps of producing a suspension-board-with-circuit assembly sheet. In FIGS. 1 and 2, the insulating cover layer 9 (described later) is omitted in order to clearly show the relative position of the conductive pattern 8.

In FIG. 1, the suspension-board-with-circuit assembly sheet 1 includes a plurality of suspension boards with circuits 2 serving as wired circuit boards and a supporting sheet 3 for supporting the suspension boards with circuits 2.

In the supporting sheet 3, each of the suspension boards with circuits 2 is arranged in an aligned state at spaced intervals to each other, and is supported by the supporting sheet 3 via supporting portions 17 which can be cut.

This suspension board with circuit 2 mounts a magnetic head (not shown) on a hard disk drive and supports the magnetic head while holding a minute gap between the magnetic head and a magnetic disk (not shown) against an airflow caused when the magnetic head and the magnetic disk travel relatively to each other. The suspension board with circuit 2 is integrally formed with a conductive pattern 8 for connecting the magnetic head and a read/write board (not shown).

As shown in FIG. 2, the conductive pattern 8 integrally includes magnetic-head-side connecting terminals 12 for connecting with connecting terminals of the magnetic head, external connecting terminals 13 for connecting with connecting terminals of the read/write board, and wires 11 for connecting between the magnetic-head-side connecting terminals 12 and the external connecting terminals 13, all mentioned later.

As shown in FIG. 3, each of the suspension boards with circuits 2 includes a metal supporting layer 6, an insulating base layer 7 formed on the metal supporting layer 6, a conductive pattern 8 formed on the insulating base layer 7, and an insulating cover layer 9 formed on the insulating base layer 7 so as to cover the conductive pattern 8.

As shown in FIG. 1, the metal supporting layers 6 are formed from a metal supporting board 14 (see FIG. 4(a)) together with the supporting sheet 3 to be described later, each formed of a flat belt-like thin plate extending in the lengthwise direction in the form corresponding to an outline of the suspension board with circuit 2. As shown in FIG. 2, in the suspension board with circuit 2, the metal supporting layer 6 is provided with a gimbal 10 formed so as to sandwich the magnetic-head-side connecting terminals 12 in the front end portion (lengthwise one end portion) thereof to mount a magnetic head. The metal that is used to form the metal supporting board 14 including the metal supporting layers 6 includes, for example, stainless steel and 42 alloy, and preferably, stainless steel is used. The metal supporting board 14 including the metal supporting layers 6 has a thickness in the range of, for example, 10 to 100 μm, or preferably 15 to 50 μm.

The insulating base layer 7 is formed over the entire upper surface (except a portion corresponding to a distinguishing mark forming portion 4 to be described later) of the metal supporting layer 6, as shown in FIG. 3. The insulator that is used to form the insulating base layer 7 includes, for example, synthetic resin such as polyimide resin, acrylic resin, polyether nitrile resin, polyether sulfone resin, polyethylene terephthalate resin, polyethylene naphthalate resin, polyvinyl chloride resin, or the like. Preferably, polyimide resin is used. The insulating base layer 7 has a thickness in the range of, for example, 3 to 30 μm, or preferably 5 to 15 μm.

As shown in FIG. 2, the conductive pattern 8 integrally includes a plurality (six pieces) of wires 11 spaced in parallel to each other, and magnetic-head-side connecting terminals 12 and external connecting terminals 13 continuous from the front end portions and the rear end portions (the lengthwise other end portions) of the wires 11, respectively. The conductor that is used to form the conductive pattern 8 includes, for example, a metal foil such as copper, nickel, gold, solder, or alloys thereof. Preferably, a copper foil is used from the viewpoints of conductivity, low cost, and processability.

The conductive pattern 8 has a thickness in the range of, for example, 3 to 20 μm, or preferably 7 to 15 μm. Each of the wires 11 has a width in the range of, for example, 5 to 500 μm, or preferably 10 to 200 μm. Each of the magnetic-head-side connecting terminal 12 and each of the external connecting terminal 13 have a width in the range of, for example, 20 to 800 μm, or preferably 30 to 500 μm. The spacing between each of the wires 11, the spacing between each of the magnetic-head-side connecting terminals 12, and the spacing between each of the external connecting terminals 13 are in the range of, for example, 5 to 500 μm, or preferably 10 to 200 μm.

The insulating cover layer 9 is formed on the upper surface of the insulating base layer 7 in a pattern corresponding to a portion where the conductive pattern 8 is formed. Specifically, the insulating cover layer 9 is formed in a pattern which covers the wires 11 and exposes the magnetic-head-side connecting terminals 12 and the external connecting terminals 13, though not shown in FIG. 3. As the insulator that is used to form the insulating cover layer 9, the same insulator as that used to form the insulating base layer 7 mentioned above is used, or preferably a polyimide resin is used. The insulating cover layer 9 has a thickness in the range of, for example, 2 to 20 μm, or preferably 4 to 15 μm.

As shown in FIGS. 1 and 2, in the method for producing the suspension-board-with-circuit assembly sheet 1 to be described later (see FIG. 4(a)), the supporting sheet 3 is formed together with each of the supporting portions 17 and each of the metal supporting layers 6 by cutting out the metal supporting board 14 partially so as to correspond to an outline of each of the suspension boards with circuits 2.

The supporting sheet 3 has clearance grooves 24 each having a generally frame-like shape in plane view surrounding each of the suspension boards with circuits 2, formed between the inner peripheral portion of the supporting sheet 3 and the outer peripheral portion of each of the suspension boards with circuits 2, these two portions surrounding each of the suspension boards with circuits 2.

The supporting sheet 3 also has a plurality of supporting portions 17 formed across the clearance grooves 24.

As shown in FIG. 3, each of the suspension boards with circuits 2 in the suspension-board-with-circuit assembly sheet 1 is provided with a distinguishing mark forming portion 4 in which a distinguishing mark 15 (see FIG. 4(*f*)) is marked in the marking step to be described later.

As shown in FIG. 1, the distinguishing mark forming portion 4 is provided corresponding to each of the suspension boards with circuits 2 and is arranged in each of the suspension boards with circuits 2 in plane view. That is, as shown in FIG. 2, the distinguishing mark forming portion 4 is arranged between the widthwise adjacent wires 11 in spaced relation thereto in the widthwise direction and between the magnetic-head-side connecting terminals 12 and the external connecting terminals 13 in the lengthwise direction.

The distinguishing mark forming portion 4 is divided by a weir portion 5 as shown in FIG. 3.

The weir portion 5 is provided in order to prevent the distinguishing mark 15 from flowing out from the distinguishing mark forming portion 4. The weir portion 5 is formed from the insulating base layer 7, and surrounds the distinguishing mark forming portion 4 in plane view. Further, the weir portion 5 is formed as the peripheral portion of a base opening 16 exposing the distinguishing mark forming portion 4 in the insulating base layer 7. The insulating base layer 7 forming the weir portion 5 is formed continuously with the insulating base layer 7 corresponding to the conductive pattern 8 (wires 11) in the widthwise direction.

The base opening 16 is formed in a generally circular shape in plane view extending through the insulating base layer 7 so as to correspond to the distinguishing mark forming portion 4.

The weir portion 5 has an inner diameter (an inner diameter of the base opening 16) in the range of, for example, 50 to 1000 or preferably 100 to 600 μm. When the inner diameter of the weir portion 5 is less than the above range, the visibility of the distinguishing mark 15 after the marking step may deteriorate. In addition, when the inner diameter of the weir portion 5 exceeds the above range, the layout of the arrangement of the conductive pattern 8 may be limited.

The distinguishing mark 15 is formed in order to distinguish between defectiveness and non-defectiveness of the suspension board with circuit, as shown in FIG. 4(*f*). For example, an ink is used as the distinguishing mark 15. The color of the ink is not particularly limited, and when the metal for forming the metal supporting layer 6 is a (white-colored) stainless steel, a black ink, an orange ink, or the like is preferably used from the viewpoints of visibility and contrast.

Next, a method for producing the suspension-board-with-circuit assembly sheet 1 is described with reference to FIG. 4.

In this method, a metal supporting board 14 is first prepared, as shown in FIG. 4(*a*). As referred to FIG. 1, the metal supporting board 14 is formed of a flat plate having a generally rectangular shape in plane view.

Subsequently, in this method, as shown in FIG. 4(*b*), an insulating base layer 7 is formed on the metal supporting board 14. The insulating base layer 7 is formed in a pattern corresponding to a suspension board with circuit 2 and in which a base opening 16 (a weir portion 5) is formed in the suspension board with circuit 2.

The insulating base layer 7 is formed in the following manner. For example, a solution (varnish) of synthetic resin is applied to the entire upper surface of the metal supporting board 14 in the above-mentioned pattern and then dried. Next, the dried solution is heated to be cured as required. Alternatively, in the case of using a photosensitive synthetic resin, the insulating base layer 7 is formed in the following manner. The photosensitive synthetic resin is applied to the entire upper surface of the metal supporting board 14. Subsequently, the photosensitive synthetic resin thus applied is exposed to light and developed to form the above-mentioned pattern, and then heated to be cured as required. Further, the process of forming the insulating base layer 7 is not limited to the above-mentioned manner, and the insulating base layer 7 can be formed, for example, by preliminarily forming a synthetic resin into a film having the above-mentioned pattern, and then adhesively bonding the film to the entire upper surface of the metal supporting board 14 through a known adhesive layer.

As a result of this, the base opening 16, that is, the weir portion 5 can be formed, which leads to formation of a distinguishing mark forming portion 4 divided by the weir portion 5.

Then, in this method, as shown in FIG. 4(*c*), a conductive pattern 8 is formed on the insulating base layer 7 in the above-mentioned pattern. A known patterning method, such as an additive method or a subtractive method, is used to form the conductive pattern 8. Preferably, an additive method is used.

Then, in this method, as shown in FIG. 4(*d*), an insulating cover layer 9 is formed on the insulating base layer 7 in the above-mentioned pattern.

The insulating cover layer 9 is formed in the following manner. For example, the solution (varnish) of synthetic resin mentioned above is applied to the upper surface of the insulating base layer 7 in the above-mentioned pattern and then dried. Next, the dried solution is heated to be cured as required. Alternatively, in the case of using a photosensitive synthetic resin, the insulating cover layer 9 is formed in the following manner. The photosensitive synthetic resin is applied to the entire upper surface of the insulating base layer 7. Subsequently, the photosensitive synthetic resin thus applied is exposed to light and developed to form the above-mentioned pattern, and then heated to be cured as required. Further, the process of forming the insulating cover layer 9 is not limited to the above-mentioned manner, and the insulating cover layer 9 can be formed, for example, by preliminarily forming a synthetic resin into a film having the above-mentioned pattern, and then adhesively bonding the film to the entire upper surface of the insulating base layer 7 through a known adhesive layer.

Then, in this method, as shown in FIG. 4(*e*), the metal supporting board 14 is cut out to simultaneously form a gimbal 10 in the suspension board with circuit 2 and clearance grooves 24 in the supporting sheet 3.

The gimbal 10 and the clearance grooves 24 are formed by, for example, etching or the like.

Thus, the suspension-board-with-circuit assembly sheet 1 in which the suspension boards with circuits 2 each having the distinguishing mark forming portion 4 formed and the supporting sheet 3 are formed can be produced.

In addition, supporting portions 17 (see FIGS. 1 and 2) can be simultaneously formed by etching.

Subsequently, in the suspension-board-with-circuit assembly sheet 1 thus obtained, for example, the conductive pattern 8 of each of the suspension boards with circuits 2 is first inspected for the presence/absence of a broken wire (inspecting step). A known continuity test is used to inspect whether the conductive pattern 8 has a broken wire or not.

Next, as shown in FIG. 4(*f*), when the suspension board with circuit 2 is judged to be defective by the above-mentioned inspection, a distinguishing mark 15 is formed in the distinguishing mark forming portion 4 corresponding to the relevant suspension board with circuit 2 (marking step).

Specifically, in the marking step, an ink is applied to the distinguishing mark forming portion 4 on the suspension board with circuit 2 judged as defective. A known marking apparatus provided with a felt pen or other ink application means, for example, an ink-jet printer, is used to apply the ink to the distinguishing mark forming portion 4.

Thus, the distinguishing mark 15 is formed in the distinguishing mark forming portion 4 corresponding to the suspension board with circuit 2 in which the conductive pattern 8 has a broken wire. Subsequently, the distinguishing mark 15 thus formed in the distinguishing mark forming portion 4 is observed, for example, by visual inspection, or using an optical sensor such as a CCD camera (distinguishing step).

Therefore, the suspension board with circuit 2 having the distinguishing mark 15 can be distinguished as defective.

Thereafter, as shown in FIG. 4(*g*), the supporting portion 17 corresponding to the suspension board with circuit 2 that has been distinguished as defective is cut and processed to thereby remove this defective suspension board with circuit 2 from the supporting sheet 3.

On the other hand, in the distinguishing step, the suspension board with circuit 2 judged as non-defective does not have any distinguishing mark 15 in the distinguishing mark forming portion 4, so that the distinguishing mark forming portion 4 is observed, for example, by visual inspection, or using an optical sensor such as a CCD camera, to confirm that there is no distinguishing mark 15 formed therein. Therefore, the suspension boards with circuit 2 can he distinguished as non-defective. Thereafter, the non-defective suspension board with circuit 2 is cut off from the supporting sheet 3 (cutting-off step) and the non-defective suspension board with circuit 2 is mounted on a hard disk drive (mounting step).

According to the suspension-board-with-circuit assembly sheet 1, when, in the marking step, the distinguishing mark 15 is formed in the distinguishing mark forming portion 4 of the suspension board with circuit 2 to indicate that the suspension board with circuit 2 is defective, the weir portion 5 can prevent the distinguishing mark 15 from flowing out from the distinguishing mark forming portion 4. In particular, as shown in phantom line of FIG. 4(*f*), even when an excessive amount of distinguishing mark 15 is applied to the distinguishing mark forming portion 4, the weir portion 5 can effectively prevent the distinguishing mark 15 from flowing out from the distinguishing mark forming portion 4 toward the outside thereof.

Therefore, it is possible to prevent contamination of the wired-circuit-board assembly sheet 1 and the periphery thereof by the distinguishing mark 15.

In the suspension-board-with-circuit assembly sheet 1, the suspension board with circuit 2 and the supporting sheet 3 can both be formed from the same metal supporting layer 6. In addition, the suspension board with circuit 2 and the weir portion 5 can both be formed from the same insulating base layer 7.

As a result, the production steps can be simplified, whereby the wired-circuit-board assembly sheet 1 can be produced with high production efficiency.

In the above description of FIG. 4(*b*), the distinguishing mark forming portion 4 is formed simultaneously with the formation of the insulating base layer 7. However, for example, the insulating base layer 7 is first formed over the entire upper surface of the metal supporting layer 6, and thereafter, the insulating base layer 7 corresponding to the portion where the distinguishing mark forming portion 4 is formed may be removed, though not shown.

The insulating base layer 7 is removed by, for example, etching, or more specifically, wet etching using an etchant, or dry etching using a laser beam. Preferably used is wet etching using an alkaline etchant by which the metal supporting layer 6 (formed of stainless steel, etc.) is resistant to corrosion.

Among those processes for forming the distinguishing mark forming portion 4 (weir portion 5), preferably the distinguishing mark forming portion 4 is formed simultaneously with the formation of the insulating base layer 7.

Thus, the step (e.g., etching step) of removing the insulating base layer 7 can be omitted. As a result, the production steps can be simplified, whereby the wired-circuit-board assembly sheet 1 can be produced with high production efficiency.

FIGS. 5 to 8 are sectional views of a distinguishing mark on a suspension board with circuit of a suspension-board-with-circuit assembly sheet as another embodiment of the wired-circuit-board assembly sheet of the present invention. The same reference numerals are provided in the subsequent figures for members corresponding to each of those described above, and their detailed description is omitted.

Next, the suspension-board-with-circuit assembly sheet as another embodiment of the wired-circuit-board assembly sheet of the present invention is described with reference to FIGS. 5 to 8.

Figure 6:
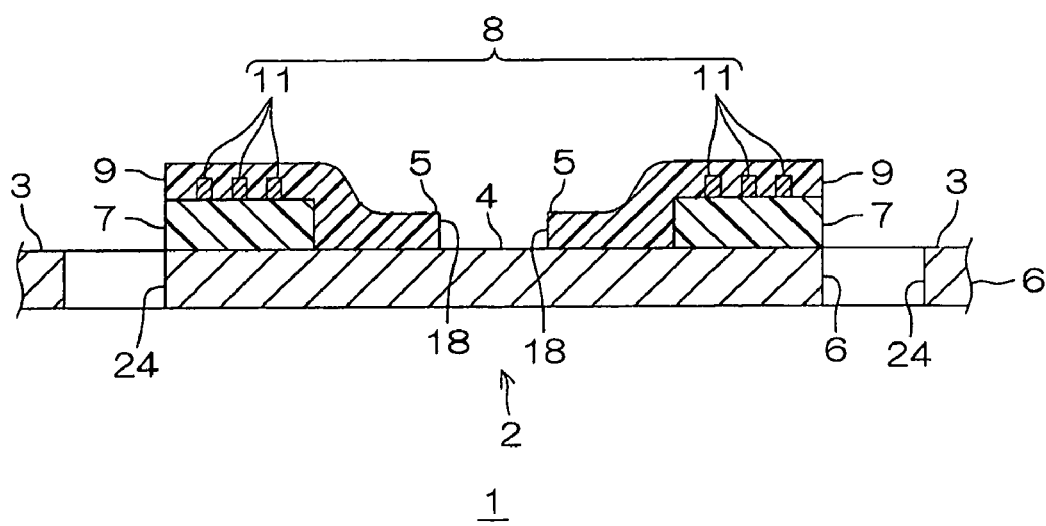
FIG. 6 is a sectional view of a distinguishing mark of a suspension board with circuit of a suspension-board-with-circuit assembly sheet as another embodiment (an embodiment in which a weir portion is formed from an insulating cover layer) of the wired-circuit-board assembly sheet of the present invention.
Figure 7:
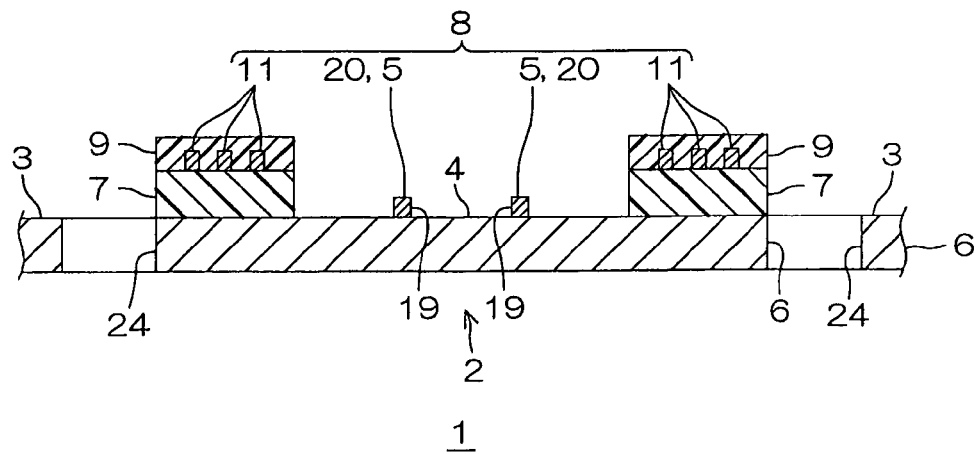
FIG. 7 is a sectional view of a distinguishing mark of a suspension board with circuit of a suspension-board-with-circuit assembly sheet as another embodiment (an embodiment in which a weir portion is formed from a conductive pattern) of the wired-circuit-board assembly sheet of the present invention.
Figure 8:
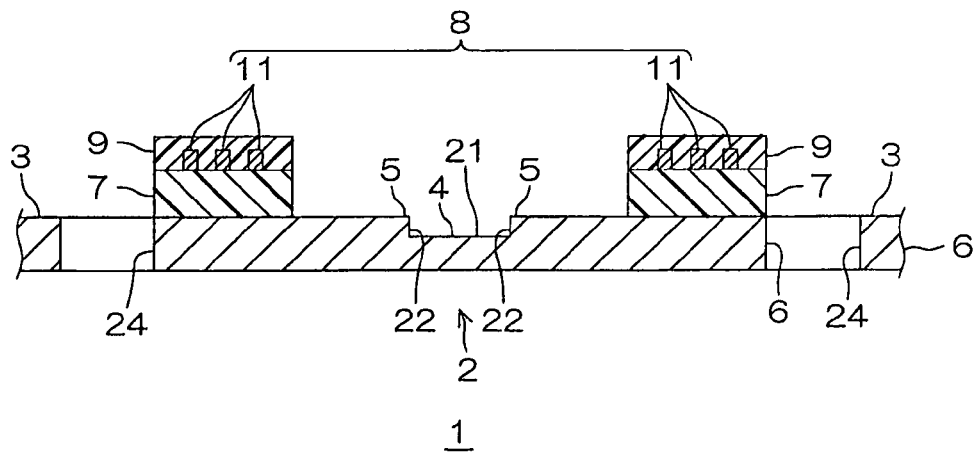
FIG. 8 is a sectional view of a distinguishing mark of a suspension board with circuit of a suspension-board-with-circuit assembly sheet as another embodiment (an embodiment in which a weir portion is formed from a metal supporting layer) of the wired-circuit-board assembly sheet of the present invention.

In the above description of FIG. 3, the weir portion 5 is formed from the insulating base layer 7. However, for example, the weir portion 5 can be formed from both the insulating base layer 7 and the insulating cover layer 9 as shown in FIG. 5, further from the insulating cover layer 9 as shown in FIG. 6, still further from the conductive pattern 8 as shown in FIG. 7, or yet still further from the metal supporting layer 6 as shown in FIG. 8.

Figure 5:
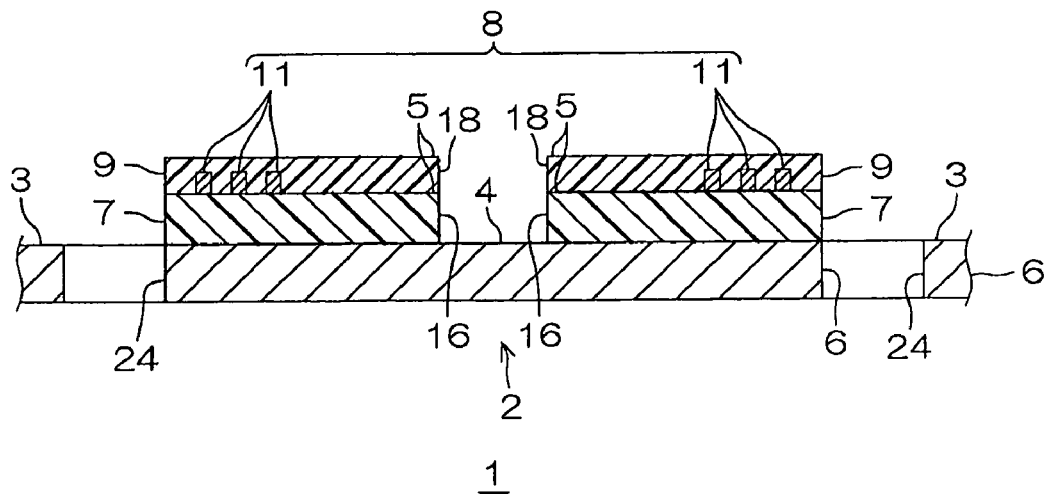
FIG. 5 is a sectional view of a distinguishing mark on a suspension board with circuit of a suspension-board-with-circuit assembly sheet as another embodiment (an embodiment in which a weir portion is formed from an insulating base layer and an insulating cover layer) of the wired-circuit-board assembly sheet of the present invention.

In FIG. 5, the weir portion 5 is formed as the peripheral portion of the base opening 16, and as the peripheral portion of a cover opening 18 which extends through the insulating cover layer 9 in the thickness direction. The cover opening 18 is formed in the same shape as the base opening 16 in plane view.

Further, the insulating cover layer 9 that forms the weir portion 5 is formed continuously with the insulating cover layer 9 corresponding to the conductive pattern 8. That is, the insulating cover layer 9 is formed in the same shape as the insulating base layer 7 in plane view except the magnetic-head-side connecting terminals 12 and the external connecting terminals 13.

The suspension-board-with-circuit assembly sheet 1 shown in FIG. 5 is produced in the same manner as above, except that the insulating cover layer 9 is formed in a pattern in which the above-mentioned cover opening 18 is formed.

In the suspension-board-with-circuit assembly sheet 1 shown in FIG. 5, the formation of the weir portion 5 from both the insulating base layer 7 and the insulating cover layer 9 can ensure sufficient thickness of the weir portion 5, which in turn can much more effectively prevent the distinguishing mark 15 from flow out.

In FIG. 6, the weir portion 5 is formed as the peripheral portion of the cover opening 18.

The insulating base layer 7 is formed in a pattern corresponding to the portion where the conductive pattern 8 is formed.

The insulating cover layer 9 is also formed on the metal supporting layer 6 exposed from the insulating base layer 7.

The suspension-board-with-circuit assembly sheet 1 shown in FIG. 6 is produced in the same manner as above, except that the insulating base layer 7 is formed in the pattern corresponding to the portion where the conductive pattern 8 is formed, and the insulating cover layer 9 is formed on the insulating base layer 7 and the metal supporting layer 6 exposed from the insulating base layer 7 in the above-mentioned pattern.

In the suspension-board-with-circuit assembly sheet 1 shown in FIG. 6, the suspension board with circuit 2 and the weir portion 5 can both be formed from the same insulating cover layer 9. Therefore, the production steps can be simplified.

In FIG. 7, the weir portion 5 is formed as a conductive weir portion 20 formed from the conductive pattern 8. The conductive weir portion 20 is formed on the metal supporting layer 6 in a generally ring (annular) shape in plane view. That is, the conductive weir portion 20 is formed as the peripheral portion of the conductive opening 19 open to the inside thereof.

The suspension-board-with-circuit assembly sheet 1 shown in FIG. 7 is produced in the same manner as above, except that the conductive pattern 8 is formed in a pattern having the conductive weir portion 20.

In the suspension-board-with-circuit assembly sheet 1 shown in FIG. 7, the suspension board with circuit 2 and the weir portion 5 can both be formed from the same conductive pattern 8. Therefore, the production steps can be simplified.

In FIG. 8, the weir portion 5 is formed in the form of a step shaped in the peripheral portion of a groove 21 so that the upper side of the metal supporting layer 6 is hollowed.

The suspension-board-with-circuit assembly sheet 1 shown in FIG. 8 is produced in the same manner as above, except that, in the metal supporting layer 6 (see FIG. 4(d)) on which the insulating cover layer 9 is formed, the groove 21 is formed by half-etching of a portion in which the distinguishing mark forming portion 4 is formed, from the upper side of the portion to halfway through the thickness thereof.

Among the suspension-board-with-circuit assembly sheets 1 shown in FIG. 3 and FIGS. 5 to 8 described above, the embodiment in which the weir portion 5 is formed from the insulating base layer 7 (FIG. 3), the embodiment in which the weir portion 5 is formed from the insulating base layer 7 and the insulating cover layer 9 (FIG. 5), the embodiment in which the weir portion 5 is formed from the insulating cover layer 9 (FIG. 6), and the embodiment in which the weir portion 5 is formed from the conductive pattern 8 (FIG. 7) are preferable. According to these embodiments, the need for the half-etching process for forming the groove 21 (FIG. 8) can be eliminated. Therefore, the production steps can be more simplified, whereby the suspension-board-with-circuit assembly sheet 1 can be produced with more excellent production efficiency.

In the above description, the distinguishing mark forming portion 4 is provided one in each suspension board with circuit 2. However, the number thereof is not particularly limited and, for example, the distinguishing mark forming portion 4 can be provided in plural.

In the above description, the distinguishing mark forming portion 4 is formed in a generally circular shape in plane view. However, the shape thereof is not particularly limited and, for example, the distinguishing mark forming portion 4 can be formed in an appropriate shape such as a generally rectangular shape in plane view or a generally triangular shape in plane view.

In the above description, the distinguishing mark forming portion 4 is provided between the adjacent wires 11 in the widthwise direction between the magnetic-head-side connecting terminals 12 and the external connecting terminals 13 in the lengthwise direction. However, the arrangement thereof is not particularly limited, and the distinguishing mark forming portion 4 may be provided, for example, in the front side (one side in the lengthwise direction) of the magnetic-head-side connecting terminals 12, or the rear side (the other side in the lengthwise direction) of the external connecting terminals 13, and can be provided in both the widthwise outsides of the wires 11.

In the above description of FIG. 2, the conductive pattern 8 is formed so as to include the magnetic-head-side connecting terminals 12, the external connecting terminals 13, and the wires 11. However, for example, the conductive pattern 8 can be formed so as to further have inspection terminals, though not shown.

In this case, the inspection terminals are provided in order to connect to connecting terminals of a known continuity test apparatus for conducting a continuity test on the suspension board with circuit 2 after the distinguishing step, and are arranged on the rear side of the external connecting terminals 13.

On the rear side of the external connecting terminals 13, inspection wires, which are not shown, are formed continuously with the external connecting terminals 13, and connects between the inspection terminals and the external connecting terminals 13.

The insulating cover layer 9 covers the inspection wires and is formed in a pattern exposing the inspection terminals.

The conductive pattern 8 integrally includes the magnetic-head-side connecting terminals 12, the external connecting terminals 13, the inspection terminals (not shown), the wires 11, and the inspection wires (not shown).

In this suspension board with circuit 2, portions (the metal supporting layer 6, the insulating base layer 7, and the insulating cover layer 9) corresponding to the inspection terminals are cut off from the portions corresponding to the magnetic-head-side connecting terminals 12, the external connecting terminals 13, and the wires 11 therebetween during the mounting step (or after the cutting-off step and before the mounting step).

In this suspension board with circuit 2, it is preferable that the distinguishing mark forming portion 4 is provided between the magnetic-head-side connecting terminals 12 and the external connecting terminals 13.

Such provision allows the distinguishing mark forming portion 4 to remain in the suspension board with circuit 2 after the mounting step. Therefore, even if an error occurs in a hard disk drive, it is possible to reliably confirm that the suspension board with circuit 2 judged as non-defective has been mounted on the hard disk drive by observing that the distinguishing mark 15 is not formed in the distinguishing mark forming portion 4. In other words, it is possible to reliably confirm that the suspension board with circuit 2 judged as defective has not been mounted on the hard disk drive.

In the above description, the inspection terminals are arranged on the rear side of the external connecting terminals 13. However, for example, they can be arranged on the front side of the magnetic-head-side connecting terminals 12, though not shown. In this case, the inspection wires (not shown) are formed continuously with the front side of the magnetic-head-side connecting terminals 12 and connect between the inspection terminals and the magnetic-head-side connecting terminals 12.

In the above description, in the marking step, the ink is applied to the distinguishing mark forming portion 4 in the suspension board with circuit 2 judged as defective. However, for example, it is possible to reverse the application target. That is, in the marking step, the ink may be applied to the distinguishing mark forming portion 4 in the suspension hoard with circuit 2 judged as non-defective, so that the suspension board with circuit 2 without the distinguishing mark 15 can be distinguished as a defective.

In the above description, the wired-circuit-board assembly sheet of the present invention is explained as the suspension-board-with-circuit assembly sheet 1 including the suspension board with circuits 2. However, the wired circuit board of the present invention is not limited thereto and for example, it can be widely applied to other wired-circuit-board assembly sheets, such as a flexible wired circuit board assembly sheet including flexible wired circuit boards in which the metal supporting layer 6 is provided as a reinforcing layer.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired-circuit-board assembly sheet comprising a plurality of wired circuit boards and a supporting sheet for supporting the wired circuit boards in an aligned state,
    wherein each of the wired circuit boards comprises a distinguishing mark forming portion to be formed with a distinguishing mark for distinguishing between defectiveness and non-defectiveness of the wired circuit board, the distinguishing mark comprising a flowable ink,
    the distinguishing mark forming portion being surrounded by a weir portion for preventing the flowable ink which forms the distinguishing mark from flowing out from the distinguishing mark forming portion.

2. The wired-circuit-board assembly sheet according to claim 1, wherein
    each of the wired circuit boards comprises a metal supporting layer, an insulating base layer formed on the metal supporting layer, a conductive pattern formed on the insulating base layer, and an insulating cover layer formed on the insulating base layer so as to cover the conductive pattern,
    the supporting sheet is made of the metal supporting layer and is connected to each of the wired circuit boards by supporting portions, and
    the weir portion is made of at least one layer selected from the group consisting of the insulating base layer, the conductive pattern, and the insulating cover layer.

* * * * *